United States Patent [19]
Buechele

[11] Patent Number: 5,970,606
[45] Date of Patent: Oct. 26, 1999

[54] PINSTACKING PROCESS

[75] Inventor: Alvin W. Buechele, Clinton Corners, N.Y.

[73] Assignee: International Business Machines Corporation, Armonk, N.Y.

[21] Appl. No.: 09/060,143

[22] Filed: Apr. 15, 1998

Related U.S. Application Data

[62] Division of application No. 08/650,078, May 17, 1996, Pat. No. 5,768,772.

[51] Int. Cl.$^6$ .................................................. H01R 43/02
[52] U.S. Cl. ............................... 29/830; 29/464; 269/47; 269/54.5; 414/27
[58] Field of Search .............................. 29/827, 830, 825, 29/464; 269/47, 54.5; 414/27

[56] References Cited

U.S. PATENT DOCUMENTS

| | | |
|---|---|---|
| 3,014,601 | 12/1961 | Swanson . |
| 4,264,254 | 4/1981 | Chang . |
| 4,400,872 | 8/1983 | Berges . |
| 4,403,899 | 9/1983 | Lampe et al. . |
| 4,506,442 | 3/1985 | Alzmann et al. ........................ 29/830 |
| 4,991,285 | 2/1991 | Shaheen et al. . |

FOREIGN PATENT DOCUMENTS

| | | | |
|---|---|---|---|
| 3240754 | 5/1983 | Germany .................................. | 29/830 |

OTHER PUBLICATIONS

IBM Technical Disclosure Bull, vol. 20 No.12 May 1978, pp. 5172–5174 by W. Fedrowitz et al.

Primary Examiner—Carl J. Arbes
Attorney, Agent, or Firm—Whitham, Curtis & Whitham; Steven J. Soucar

[57] ABSTRACT

Stacking of a large number of delicate and easily damaged flexible lamina with highly accurate registration is automated by use of an alignment fixture having alignment pins and a stacking plate. The stacking plate is raised to and frictionally supported at a location near a tapered shoulder portion of the alignment pins on which each of a plurality of lamina is allowed to self-align. A floating head which may be used to transport lamina to the alignment pins is also self-aligned with the alignment pins and used to press the individual lamina over the alignment while maintaining precisely parallel orientation and motion of the lamina to the lamina stack and the stacking plate. The stacking plate is moved against the frictional support thereof to maintain a short effective alignment pin height or protrusion above the stacking plate or lamina stack to prevent binding or wiping motion between lamina and resultant damage of the lamina.

1 Claim, 2 Drawing Sheets

PINSTACKING PROCESS

This application is a division of U.S. patent application Ser. No. 08/650,078 filed May 17, 1996 now U.S. Pat. No 5,768,772.

BACKGROUND OF THE INVENTION

1. Field of the Invention

The present invention generally relates to the manufacture of modular electronic circuits and, more particularly, the automated manufacture of multi-layer modules (MLM), especially multi-layer ceramic modules (MLC).

2. Description of the Prior Art

In electronic circuits and high-speed logic circuitry, in particular, reduction in size and increase in integration and packaging density has yielded substantial performance improvements due to reduced signal propagation time over shorter paths and increased noise immunity due to reduced capacitive and inductive coupling to conductors and other effects. For this purpose, modular circuits have been in use for several years to allow connection of numerous integrated circuit chips of diverse types and formed by different and potentially incompatible technologies within a single, compact package. Modular circuits also provide advantages of improved heat dissipation, regulation of temperature among chips, stability and protection for complex connection arrangements which are embedded therein and the possibility of electrostatic shielding being incorporated into the design.

Modular circuits are formed by a plurality of lamina, each having a conductive pattern formed on one or both sides and perforations, known as vias, filled with conductive material for making connections between lamina or sides thereof. Generally, the conductive patterns and filling of vias is performed by screening of conductive paste through a mask using specially designed machinery. Each conductive pattern will generally be unique for each lamina of a modular circuit. The lamina are individually placed in a stack and carefully aligned with previously placed lamina. Once assembled and aligned, the lamina are joined by known methods into a unitary body such as by sintering of uncured ceramic lamina, known as green sheets, or fusing or bonding of thermoplastic lamina.

Such modular circuits may be extremely complex and require hundreds of sequentially performed processes (with testing and repair between at least small groups of steps) to produce. For example, the lamina may be punched to form an array of vias, screening is done to fill vias and form conductive patterns (implying that a production run for each unique pattern will be performed for each required pattern forming a plurality of identical lamina to be eventually be placed in each of a like plurality of modular circuits), a covering to protect the pattern and avoid contamination applied to each lamina, selection and ordering of the lamina, removal of the covering, placement and alignment of the lamina in a stack and joining of the lamina in the stack.

Even prior to screening and assembly of the green sheets, many complex processes have been required. Specifically, green sheet material has been supplied in rolls which is cut by a blanking die to approximate size. At the same time, locating holes are cut into the smaller sheets by the blanking die. The smaller sheets are then partially cured for an extended period of time, perforated with vias, stacked by capture in another punching die and again cut by another blanking die to a desired final size including a margin beyond the dimensions to which the final structure will be diced. The two blanking die cutting operations, particularly the second when green sheets are stacked and trimmed, provide a source of debris from the kerf, causing possible contamination of the green sheets with material which is cut away.

Further and perhaps more importantly, the edge formed by the second die cutting operation has been used as a reference for screening and final stacking registration, transfer to a cold frame having particular dimensions at ambient temperature and further transfer to a warm frame having the same dimensions as the cold frame when at a temperature of 80° C. for lamination whereas the registration holes have been used for punching vias. Since the vias must be accurately aligned in the finished product, any potential variation in alignment between the alignment hole and the second die cutting operation, as well as the use of a cold frame, imposes a manufacturing tolerance which must be accommodated.

It should also be appreciated that the tooling necessary for each of the two punch blanking operations is expensive both to provide and maintain. High precision dies are necessary, particularly for capture and alignment of the green sheets. The punches are fabricated from tungsten carbide to have a sufficiently durable edge but which require difficult and expensive machining to renew. Down time of the punch apparatus for approximately one day is required when the punch must be resurfaced and sharpened. Renewing of punches is required with particular frequency when cutting uncured ceramic green sheets since the ceramic material contains a high percentage of alumina which is highly abrasive. Further, the effectiveness of punches is necessarily limited for cutting stacks of material since a layer may be substantially deformed by cutting force before the punch blade emerges from another layer being cut.

Currently, most of the sequentially performed process steps subsequent to the screening process must be performed manually due to the requirement for extremely high alignment or registration accuracy and only small groups of steps have, to date, been automated. In spite of the substantial expense of such labor intensive processes, the performance of modular circuits often justifies the expense since no reasonable alternatives providing comparable performance and manufacturing flexibility and reliability are available.

The manufacturing process is further complicated by the unavoidable possibility of human error in assembly (e.g. lamina order or alignment during assembly of the lamina stacks). While the possibility of repair (known as an engineering change or, simply, EC) of modules which may fail tests performed during the course of manufacture exists and is also provided for in the design of lamina, a gross error in lamina order or alignment is unlikely to be repairable; adding to the cost of functional modules produced.

Automation of manufacture of modular circuits has also been complicated by the nature of the lamina which are included in the modular circuit. Whether the lamina are thermoplastic polymer, uncured ceramic or other material, the lamina must be kept thin to avoid the bulk and additional conductor length therethrough that would otherwise be required as well as avoiding increased stresses during thermal cycling of the modular package once placed in service. Further, the need to laminate the lamina together implies that the materials cannot be in their final form and must have properties which facilitate the lamination process. Both thinness of the lamina and their required material properties lead to an unavoidable fragility of the lamina.

Moreover, while conductive patterns of screened paste on the lamina can be stabilized somewhat by treatment (e.g.

heating, drying, etc.) after screening, the conductive patterns are very delicate and subject to damage due to both the state of the conductive material and the fineness of the patterns, particularly in layers which increase the pitch of patterned features to match connection pads of chips to be mounted thereon. Therefore, shearing motion between lamina must be scrupulously avoided when lamina are in contact with each other.

It has also been the trend in electronic devices that once a new technology has been introduced and experience gained with manufacturing and design of circuitry using that technology, the technology is applied to other more economically accessible devices. The increased performance and functionality provided by the new technology increases demand for application of the technology to an increased variety of products. By the same token, the increased experience with design and manufacturing processes tends to increase manufacturing yield and reduce cost of exploiting the new technology in a wide variety of products. However, both the compromise of the manufacturing yield and labor costs attributable to extensive human intervention in the manufacturing process has prevented sufficient reduction in cost of modular circuits for widespread use of modular circuits at the present time. Further, production volume is far too limited by labor intensive manufacturing methods to satisfy demand which would accompany use of modular circuits in a wide variety of products or even data processors usable as personal computers. Efforts to accomplish some degree of automation of the assembly process has not provided for any significant increase in throughput since all parts of an automated assembly process must be integrated for continuous assembly to increase production.

It can be appreciated from the foregoing that an extremely critical phase of manufacture of modular circuit packages which has proven a major impediment to automation is the alignment and registration of individual lamina as they are assembled into a stack. While the use of alignment pins is known in other processes (e.g. photography) to achieve and maintain high accuracy of registration of lamina, the number of lamina involved is usually very small whereas present designs generally require at least five to nine lamina (although possibly only two) and an increase in the number of lamina to perhaps over one hundred is projected.

Additionally, when increased throughput is developed by automation, it is convenient to provide for stacking of groups of stacked lamina corresponding to complete modules in order to save staging space until lamination processes are carried out. Such groups of stacked lamina must remain in good registration throughout the lamination process to avoid application of shearing forces within the individual stacks and to assure that compressional forces applied during lamination are sufficiently uniform over each stack and throughout a group of stacks.

Thus, to justify the cost outlay for automation and the development of generalized machinery to do so, substantial length (e.g. at least close to one inch) of alignment pins would be required. However, close matching of alignment pin size and location with complementary apertures in lamina is required in order to obtain the required accuracy of registration. This constraint implies friction between the lamina and the alignment pins which can change orientation of the lamina and cause binding. Green sheets, in particular, are quite brittle at room temperature (although "rubbery" at a small temperature increment thereover) and any binding is likely to cause breakage near an alignment hole.

Further, the flexibility of the lamina disturbs the geometry of hole location, as does orientation of the lamina (e.g. diverging from orthogonal to the alignment pins) making binding of the lamina on long pins unavoidable. When binding occurs as the lamina are pressed together, tearing or other damage of the fragile lamina at the alignment apertures has invariably occurred, destroying the capability of such an arrangement to provide accurate registration. At least as importantly, the flexibility of the lamina may permit a wiping motion between lamina as lamina are pressed together which can greatly damage screened paste connections while concealing such damage from detection by visual inspection since damaged connections would be between lamina.

SUMMARY OF THE INVENTION

It is therefore an object of the present invention to provide a mechanism for achieving precise registration and stacking of flexible lamina.

It is another object of the invention to provide for automation of the stacking of delicate lamina with precise registration.

It is a further object of the invention to provide a mechanism and methodology for avoiding damage to and wiping motion between delicate lamina when stacked over alignment pins.

It is yet another object of the invention to provide a method and apparatus for stacking lamina for modular circuit packages which reduces required processing of the lamina.

It is yet another object of the invention to provide a method and apparatus for removing a laminated stack from alignment pins to which individual lamina have been closely fitted without damage to the laminated stack or individual lamina thereof.

In order to accomplish-these and other objects of the invention, a method of stacking flexible lamina on alignment pins is provided including the steps of positioning a stacking plate near a free end of alignment pins, frictionally supporting the stacking plate, self-aligning a flexible lamina on a shoulder portion of the stacking pins, aligning a pressing member with the shoulder portion of the stacking pins, and pressing the flexible lamina over the alignment pins against a frictional support for the stacking plate.

In accordance with another aspect of the invention, a method for removing a laminated structure from an alignment fixture including alignment pins is provided comprising the steps of mounting the alignment fixture with the laminated structure on an alignment station, and pressing a stacking plate on which the laminated structure is formed toward a free end of the alignment pins with the support arrangement of the alignment station.

In accordance with a further aspect of the invention, an apparatus for aligning and stacking lamina is provided including a stacking fixture including alignment pins and a stacking plate moveable along said alignment pins, an arrangement for positioning the stacking plate proximate a free end of the alignment pins, clutches for frictionally supporting the stacking plate, and a head for pressing a lamina self-aligned with the alignment pins over the alignment pins to reposition the stacking plate along the alignment pins against frictional support of the stacking plate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
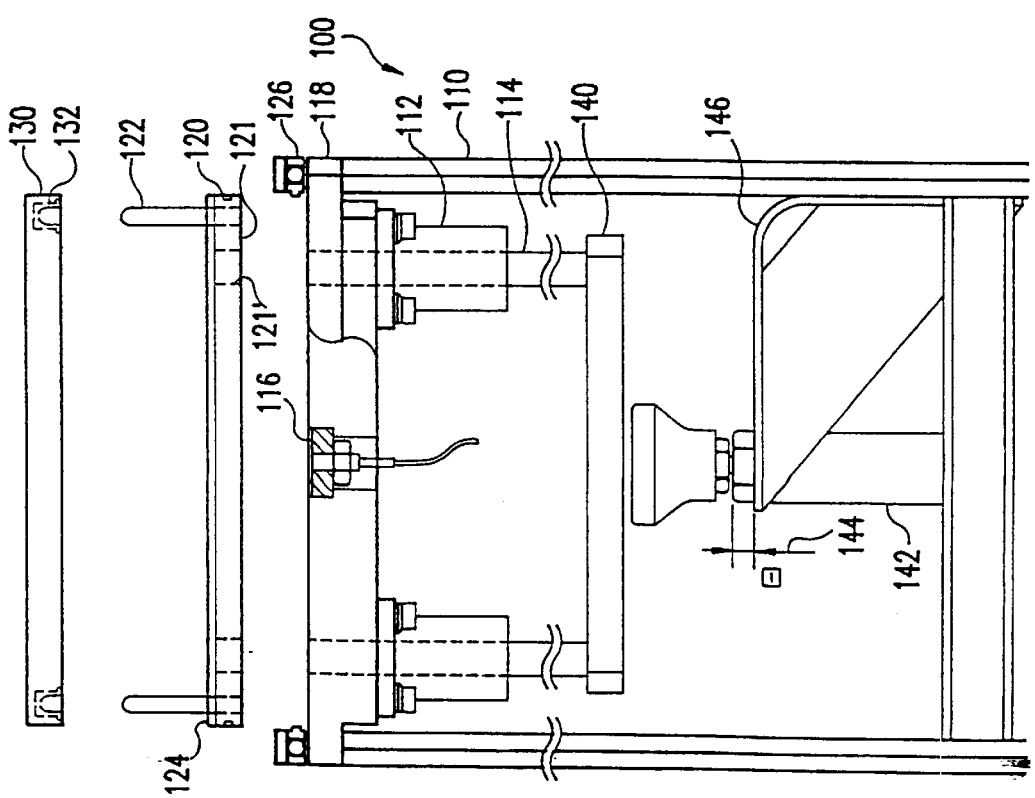
FIG. 1 is a side view of the invention at a first stage of operation thereof.

Referring now to the drawings, and more particularly to FIG. 1, there is shown a side view of an alignment and stacking apparatus in accordance with the invention at a first stage of operation. The invention will be described with reference to an apparatus and preferred lamina transport mechanisms therein for automating a larger portion of the process for assembly of multi-layer ceramic (MLC) or other modular circuit packages which is described in detail in concurrently filed U.S. patent application Ser. No. 08/651,192 (Attorney's Docket Number FI9-95-189), assigned to the assignee of the present invention and hereby fully incorporated by reference for describing an exemplary environment of the present invention and operations of components of the present invention which are not critical to the successful practice of the present invention and which will assist in the application of the present invention to various other environments, machines and processes. Accordingly, it should be appreciated that the present application has applicability to the stacking of any sheet material and is independent of the transport mechanism or geometry employed in any apparatus with which the invention may be utilized. It should also be appreciated that the apparatus can be used alone, with only a sheet material transport mechanism or with any number of additional components in any apparatus requiring stacking of sheet material.

The apparatus illustrated in FIG. 1 may be used in a stand-alone fashion or included within other apparatus and has three basic components which cooperate to provide the meritorious function of the invention. Specifically, the apparatus includes a stacking/removal mechanism 100 which is also referred to as an alignment station in the above-incorporated application, a pin stacking assembly 120 and a floating stack head 130. Each of these components will preferably have additional functions in the overall apparatus, if any, with which the invention may or may not be employed. Specifically, in the preferred environment of the invention, the stacking/removal mechanism 100, possibly in combination with a floating head assembly 130, provides fine adjustment of alignment of the stack pin assembly 120 which, in turn, is preferably removable therefrom in an automated manner such that a continuous supply of pin stack assemblies 120 is provided for continuous production. Floating head assembly 130 also is preferably used to transport lamina and/or other sheet material such as separator plates or mylar separator sheets to the alignment station. (In the environment of the above-incorporated application, however, different heads are used for lamina and separator sheet materials in the interest of speed of operation and throughput capacity. It is also to be understood that other variations of the invention which are immaterial to the practice of the preferred embodiment of the invention are utilized in that environment for reasons specific to that environment.)

Addressing each of these components in turn, stacking/removal mechanism 100 includes a frame 110 supporting a mounting plate 118 and preferably providing for fixedly mounting the invention on some other stationary or movable structure (not shown). Mounting plate 118 carries a suction fixture 116 and a plurality (preferably four) of linear friction slip clutches 112 through which stack support rods 114 are passed and supported for parallel motion. Support rods 114 are also joined together by stack support arm 140, by which the stack support rods are constrained to move in unison in response to action (e.g. 144) of linear actuator 142, preferably a pneumatic actuator or a solenoid. Actuator 142 is supported by yoke 146 which is, in turn, supported by frame 110 and is either fixed or moveable relative thereto in the direction of the axis of actuator 142.

The pin stack assembly 120 is a fixture principally comprising a base plate 121 with upstanding alignment pins 122 affixed thereto and a stacker plate 124 having apertures which engage and ride on the alignment pins 122. The stack assembly fixture 120 is preferably detachable from the stacking/removal mechanism 100 and conveyable to the top of mounting plate 118 manually or by any of a plurality of suitable robotics mechanisms such as a carousel. Fine alignment of the stack assembly fixture 120 on mounting plate 118 is preferably achieved with pivoted robotic levers or cams 126, engaging apertures 121' with ends of stack support rods 114 and/or by lowering the floating head assembly 130 until pin alignment bushings 132 engage the alignment pins 122 to cause the pin stack assembly 120 to shift laterally on mounting plate 118. It should be noted that the floating stack head 130 is referred to as floating since it is preferably arranged to readily shift laterally about a nominal position (e.g. by spring biased centering) in operations to be described in greater detail below. In the latter fine alignment arrangement, however, it is preferred to provide a braking, detent, vacuum attraction or similar arrangement to fix the floating head at the nominal, centered location during the fine alignment of the pin stack assembly.

Once the fine alignment of the pin stack assembly 120 is performed, the pin stack assembly 120 is fixed in position by applying a vacuum to the underside thereof by means of vacuum fitting 116. It should be noted in this regard that many other means of fixing the pin stack assembly 120 to mounting plate 118 are known (e.g. electromagnets, capacitive attraction, etc.) and may be used for the purpose in some cases. However, electromagnetic attraction is inappropriate to some structures which may be included in modular packages and capacitive coupling is inappropriate to others. Therefore vacuum mounting is much preferred in the interest of generality of applicability of the invention for its preferred purpose.

Floating stack head 130 is essentially a sheet handler preferably in the form of a vacuum plate resiliently mounted, as alluded to above, on a vertically reciprocable actuator (not shown), preferably of the pneumatic type. Freedom of motion relative to the actuator provided by the resilience of the mounting arrangement should be limited in the vertical direction to a fraction of the thickness of a lamina as will be discussed below while freedom of motion in the horizontal direction should be limited to about one quarter of the alignment pin diameter from a central location. Thus in a later operation which will be discussed in greater detail below, the floating head 130 will be able to shift laterally when lowered onto the pins to press sheets together such that pin alignment bushings 132 will firmly engage the pins 122 and eliminate further lateral motion as the lamina are pressed together.

Figure 2:
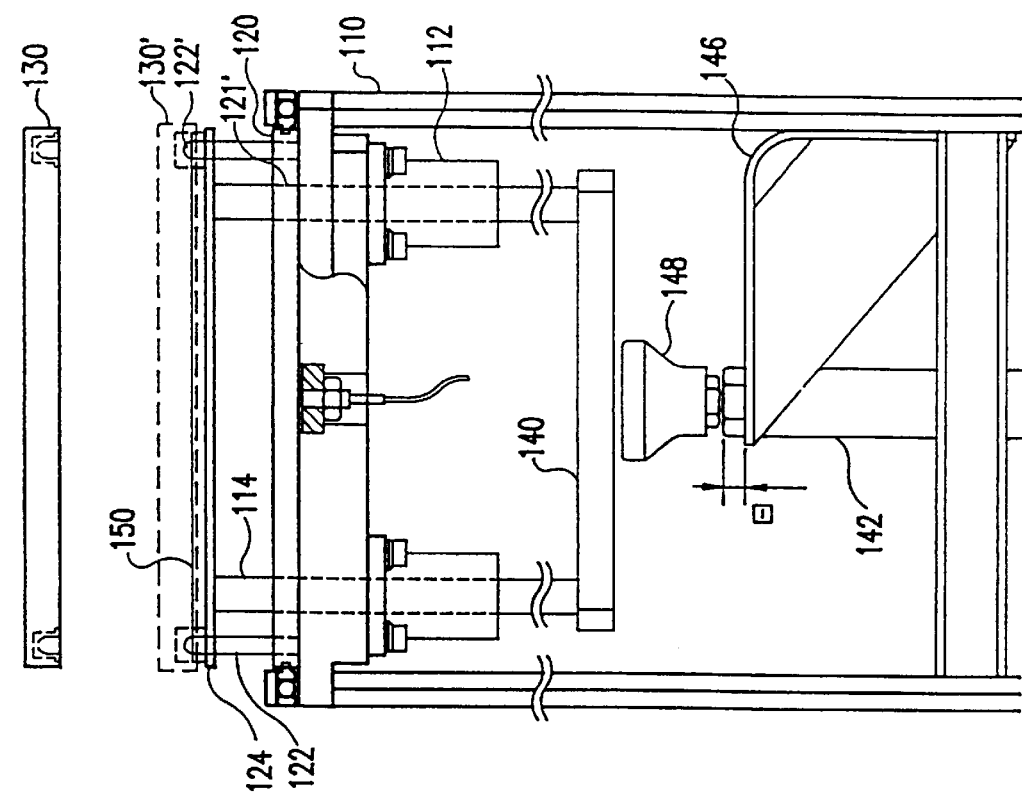
FIG. 2 is a side view of the invention at a second stage of operation thereof.

FIG. 2 shows a further side view of the invention at a second, later stage of operation. In comparison with FIG. 1, after fixing the fine position of the pin stack assembly 120 by one or more of the arrangements discussed above or the like, the driving head 148 of actuator 142 is driven against stack support arm 140 either by action of actuator 142. This actuator action and consequent movement of stack support arm 140 raises the stack support rods 114 through apertures 121' and against the bottom of stacking plate 124 to raise stacking plate on alignment pins 122 to a location near the shoulder of a tapered portion 122' on a free end thereof. This effectively provides a very short alignment pin protrusion above the stacking plate 124 or existing stack for receiving and engaging the alignment apertures of the lamina to provide alignment thereof. The stacking plate 124 is held in position by the frictional engagement of stack support rods 114 by slip clutches 112.

In this regard, it should be noted that, since the stacking plate 124 can be raised to effectively shorten the alignment pins 122 for prevention of binding and wiping motion between lamina and the potential damage associated therewith, the overall length of the alignment pins 122 is theoretically unlimited by the principles of the invention, although it may be limited to a few inches by the aspect ratio and materials of the alignment pins 122 or the force (which increases with stack height) that must be applied after lamination to remove the fixture 120 from the stack. In the preferred embodiment of the invention at the present time, the alignment pins 122 are limited to slightly less than one inch by the dimensions of current lamination presses for modular circuit packages which has nothing to do with the practice of the basic principles of the invention.

At this point, floating head 130 is made to engage a lamina or green sheet at the location of a supply thereof and to transport it to a location above the alignment pins 122. It is to be understood that this operation could be done manually or with a different head. Preferably, the head 130 is brought to a position at which the lamina or green sheet is about $1/16$ inch above the top of the alignment pins 122 prior to release of the lamina.

When the lamina is released, it falls downwardly under gravity and self-aligns on the tapered shoulders 122' of the alignment pins 122 at approximately the location shown at 150. Clearance above stacking plate 124 is not particularly important for the first lamina so placed. However, the clearance could be regulated by pressing the floating head 130 directly against the stacking plate 124 prior to placement of the first lamina in much the same manner as will be discussed below for later lamina.) Floating head 130 is then lowered further and is centered by seating on the shoulders 122' of the alignment pins. Releasing the lamina to self-align on the alignment pins 122 and then aligning the floating head 130 to the same alignment pins 122 avoids any criticality of the alignment of the floating head 130 with the lamina during pick-up or transport of the lamina. The floating head 130 thus assures parallel alignment of the lamina and equal motion of the lamina along each of the alignment pins 130, thus preventing binding and tearing or other damage at the alignment holes. Wiping motion of later-stacked lamina against those already stacked is also prevented so that the screened conductive pattern is not damaged.

It is preferred that the floating head press the lamina down over the shoulder 122' of the alignment pins 122 and onto the cylindrical portion of the alignment pins 122 by a distance equal to the thickness of a lamina or green sheet plus about 0.01 inches. The latter increment of distance corresponds to the distance slip clutches 112 may allow motion of the rods 114 without slippage or rebound of the friction mechanism including elastic compression of plate 124 and rods 114 (whether or not detectable). Vertical floating motion of the floating head 130 should be limited accordingly.

Figure 3:
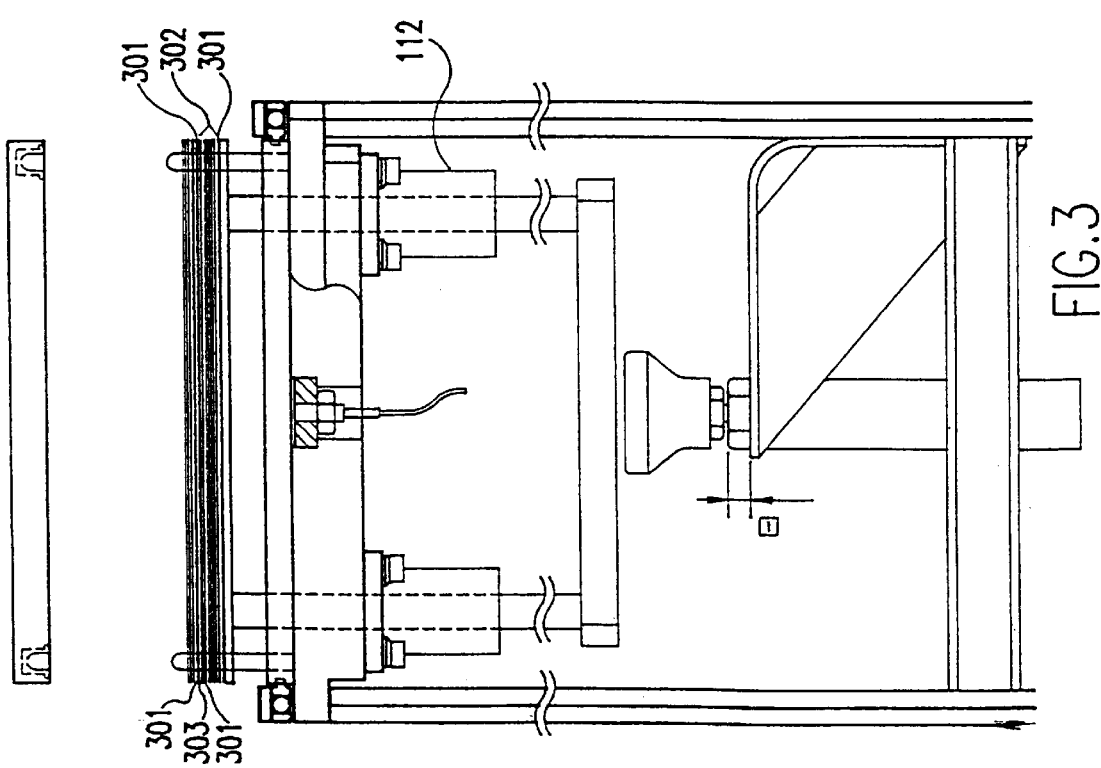
FIG. 3 is a side view of the invention at a third stage of operation thereof.

The above process is then repeated as illustrated in FIG. 3. The floating head action in releasing each lamina and then pressing the lamina down on the stack continues to assure precise alignment of the lamina, freedom from wiping motions, parallelism of the lamina and equalization and regulation of compressive forces against the linear slip clutches.

It should also be noted from FIG. 3 that the process is applicable to different types of lamina provided in the same stacking process. Specifically, as alluded to above, the height of the alignment pins 122, even when limited to somewhat less than one inch, accommodates a number of lamina which is several times the number of lamina required for many current modular circuit designs. Thus, the alignment pin height allows stacking of groups of lamina, each of which includes all lamina necessary to a particular modular circuit design. This allows for reduction of storage area between stacking and lamination, improved regulation of lamination forces and increased throughput of the lamination presses and other lamination apparatus.

To further improve uniformity of lamination force uniformity across each group of lamina and to aid in separation of the groups after lamination, it is preferred to place a metal plate 303, similar to stacking plate 124 and freely moveable over the alignment pins 122, between groups of lamina 302. Even though it is not necessary to press such a plate down on the stack, operation of the floating head as described above provides proper clearance for the next laminate to be placed thereover by pushing down the stack against linear slip clutches 112.

To further facilitate separation a mylar sheet 301 is stacked between groups of lamina 302 and each separator plate 301 (e.g. as the first lamina on stacking plate 124 and before and after each separator plate 301). The stacking of a mylar sheet 301 on stacking plate 124 also eliminates a need to adjust clearance for the first green sheet or other lamina, as mentioned above. Supplies of separator plates 303 and mylar sheets 301, either separately or interleaved together, may be located at any convenient point or points along the locus of horizontal travel of the floating head or any other head or heads which may be separately provided for the purpose of transporting the separator plates 303 and mylar sheets 301 to the alignment station provided by the invention.

Figure 4:
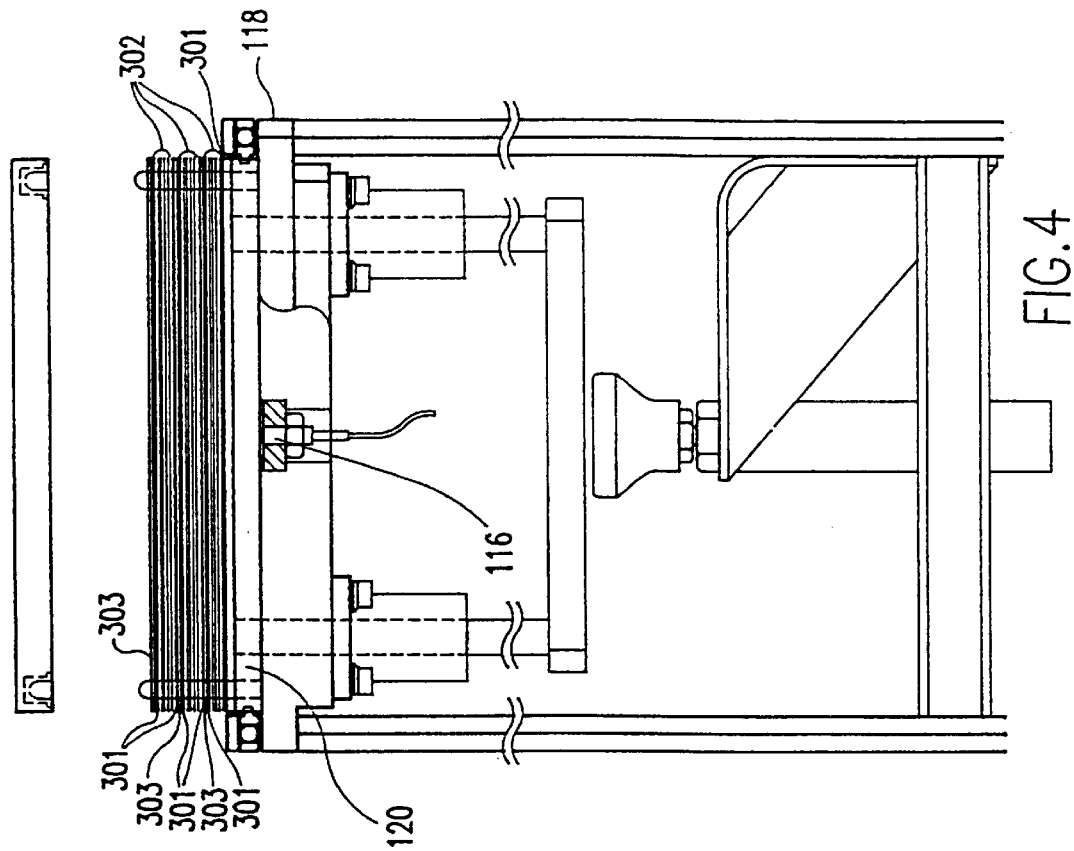
FIG. 4 is a side view of the invention at a fourth stage of operation thereof.

As illustrated in FIG. 4, three complete groups of lamina have been stacked, separated and covered by separator plates 303 and mylar sheets 301. At this point, the vacuum applied at fitting 116 can be released and the entire pin stacking assembly 120 with lamina 301, 302, 303 stacked thereon can be removed from mounting plate 118 and transferred to a warm frame for establishing a uniform temperature for lamination and, in due course, to a lamination press and oven for lamination. After lamination, the lamina stack is removed from the pin stacking assembly 120 by placing the pin stacking assembly onto the same or another stacking/removal assembly 100 and using actuator 142 to raise the stacking plate 124 and the lamina stack upwards on alignment pins 122 by pressing rods 114 upwards in a precisely parallel motion, as before. This action assures removal of the laminate from alignment pins without damage.

In view of the foregoing, it is seen that the invention provides a mechanism for achieving precise alignment and registration of delicate and easily damaged lamina while preventing wiping motions therebetween in an automated manufacturing process. The method and apparatus in accordance with the invention thus provides for lower cost and higher manufacturing yield at increased throughput of both the process and apparatus of the invention and later utilized lamination equipment. Additionally, the individual lamina can be adequately prepared for processing by the invention by processing which is reduced from current processing by the elimination of a die cutting step, the use of a cold frame and the use of a punch die to capture and stack sheets.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method for removing a laminated structure from an alignment fixture including alignment pins, said laminated structure including a plurality of lamina placed on said alignment pins over a stacking plate while said stacking plate was supported by support arrangement of an alignment station and said alignment pins were substantially stationary, said method comprising the steps of mounting said alignment fixture with said laminated structure on an alignment station, and raising said stacking plate and said laminated structure on said alignment pins and toward a free end of said alignment pins with said stacking arrangement such that said stacking plate and said laminated structure are removed from said alignment pins.

* * * * *